United States Patent
Tel et al.

(10) Patent No.: US 7,580,113 B2
(45) Date of Patent: Aug. 25, 2009

(54) METHOD OF REDUCING A WAVE FRONT ABERRATION, AND COMPUTER PROGRAM PRODUCT

(75) Inventors: Wim Tjibbo Tel, Helmond (NL); Freerk Adriaan Stoffels, Eindhoven (NL); Laurentius Catrinus Jorritsma, Helmond (NL); Tammo Uitterdijk, De Bilt (NL); Johannes Wilhelmus De Klerk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 489 days.

(21) Appl. No.: 11/473,323

(22) Filed: Jun. 23, 2006

(65) Prior Publication Data
US 2007/0296938 A1   Dec. 27, 2007

(51) Int. Cl.
G03B 27/42 (2006.01)
G03B 27/32 (2006.01)
G03B 27/52 (2006.01)
(52) U.S. Cl. .............................. 355/53; 355/77; 355/55
(58) Field of Classification Search ................... 355/53, 355/52, 55, 77
See application file for complete search history.

(56) References Cited

U.S. PATENT DOCUMENTS

| | | | |
|---|---|---|---|
| 6,710,856 B2 | 3/2004 | Van Der Laan et al. | 355/71 |
| 6,809,797 B2 | 10/2004 | Baselmans et al. | 355/52 |
| 2002/0001088 A1 | 1/2002 | Wegmann et al. | 356/521 |
| 2003/0071986 A1 | 4/2003 | Geh et al. | 356/124 |
| 2005/0128447 A1* | 6/2005 | Shiode | 355/52 |
| 2005/0254024 A1 | 11/2005 | Marie Van Greevenbroek et al. | 355/30 |

OTHER PUBLICATIONS

Shimizu et al., "Abberration Optimizing System Using Zernike Sensitivity Method", Proceedings of SPIE, vol. 5040 (2003), pp. 1581-1590.

* cited by examiner

*Primary Examiner*—Peter B Kim
(74) *Attorney, Agent, or Firm*—Pillsbury Winthrop Shaw Pittman LLP (57) ABSTRACT

A method of reducing a wave front aberration is provided for a lithographic process whereby the reducing is based on the selected pattern to be printed and the selected illumination mode used for exposure. Wave front aberrations of a projection system of a lithographic apparatus are measured and reduced by calculating adjustments of optical elements of the projection system and applying the calculated adjustments to the projection system. The calculation of adjustments is based on information on a spatial distribution of radiant intensity in a pupil of the projection system as present during exposing the radiation sensitive layer, and is limited to aberrations in projection lens pupil areas of relative high radiant flux.

21 Claims, 11 Drawing Sheets

METHOD OF REDUCING A WAVE FRONT ABERRATION, AND COMPUTER PROGRAM PRODUCT

BACKGROUND OF THE INVENTION

1. Field of the Invention

This invention relates to a method of reducing a wave front aberration of an optical wave traversing a projection system of a lithographic apparatus and a computer program product comprising program code to control a lithographic apparatus to perform a device manufacturing method.

2. Description of Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of one or several dies) on a substrate (e.g. a silicon wafer). The lithographic apparatus comprises an illumination system to illuminate the mask and a projection system (also referred to as a projection lens) to transfer the pattern, via imaging, onto a layer of radiation-sensitive material (resist) provided on the substrate. In general, a single substrate will contain a network of adjacent target portions that are successively patterned.

Known lithographic apparatus include so-called steppers or step-and-repeat apparatus, and so-called scanners or step-and-scan apparatus. In a stepper, each target portion is irradiated by exposing an entire pattern onto the target portion at one time, and the wafer is moved by a predetermined amount to a next position for a next exposure. In a scanner, each target portion is irradiated by scanning the pattern through a radiation beam in a given direction (the "scanning" direction) while synchronously scanning the substrate parallel or anti-parallel to this direction, and next the wafer is moved to a next position for a next exposure.

In the practice of optical lithography for the manufacturing of IC devices, there is a continuing desire to enhance the lithographic projection apparatus performance in terms of throughput, i.e., the number of wafers that can be exposed per unit of time. The throughput is directly proportional to the power of the radiation provided by a radiation source which is coupled to the illumination system.

With increasing power also any residual absorption of radiation traversing the projection lens by material of optical elements or coatings on optical elements is becoming more critical. The beam of radiation propagating through the projection lens causes a local, generally non-uniform heating of optical elements. Such a heating may cause thermal deformations of the projection lens elements and hence, an optical wave aberration error.

A wave aberration is usually considered as being composed of a sum of weighted, basic wave-aberration components, the set of basic wave aberration components being a set of spatial phase-distributions described by a corresponding set of normalized, orthogonal polynomials expressed in projection lens pupil coordinates in a plane perpendicular to an optical axis of the projection lens.

Conventional methods to compensate or partially compensate a wave aberration change include applying small displacements or rotations from nominal position and nominal orientation of projection lens optical elements (lenses, groups of lenses ), or applying small deformations of lens element shapes. Thereto, a projection lens is equipped with a limited number of lens manipulators. Lens manipulators are connected to a controller for calculating and applying manipulator settings and manipulator-setting changes. Wave aberration errors which are rotationally symmetric with respect to the optical axis of the projection lens or lower order wave aberration errors (for example, described by polynomials of second order in the pupil coordinates) can be reduced using the manipulator settings. However, compensation results obtained with the conventional techniques in the presence of higher-order wave-aberration errors are not satisfactory. Uncorrectable higher-order wave-aberration errors remain present in the image forming radiation beam near or at the substrate. Such a residual wave aberration is a source of errors for a latent pattern image as well as for processed, printed patterns. For example feature size errors, and pattern-asymmetry errors may be present.

SUMMARY OF THE INVENTION

It is an object of an embodiment of the present invention to reduce an effect of an optical wave aberration of a projection system of a lithographic apparatus and in particular to alleviate the problem of pattern errors caused by a presence of higher-order wave-aberration errors.

According to an aspect of the invention there is provided a method of reducing a wave front aberration of an optical wave traversing a projection system of a lithographic apparatus constructed and arranged to expose a radiation sensitive layer on a substrate to an image of a pattern. The method comprises obtaining information on the wave front aberration, calculating at least one adjustment of at least one optical element of the projection system for reducing the wave front aberration, applying the calculated at least one adjustment to the projection system, whereby the calculating includes obtaining information on a spatial distribution of radiant intensity in a pupil of the projection system as present during exposing the radiation sensitive layer, selecting a threshold intensity in a range between maximum intensity of the distribution of intensity and zero, defining areas in the pupil within which a local intensity is higher than the threshold intensity, and limiting the reducing to areas of the wave front corresponding to the areas in the pupil.

According to another aspect of the invention there is provided a computer program product comprising program code to control a lithographic apparatus to perform a device manufacturing method comprising obtaining information on the wave front aberration, calculating at least one adjustment of at least one optical element of a projection system of the lithographic apparatus, and for reducing the wave front aberration, applying the calculated at least one adjustment to the projection system, whereby the calculating includes: obtaining information on a spatial distribution of radiant intensity in a pupil of the projection system as present during exposing a radiation sensitive layer provided on a substrate, selecting a threshold intensity in a range between a maximum intensity of the distribution of intensity and zero, defining areas in the pupil within which a local intensity is higher than the threshold intensity, and limiting the reducing to areas of the wave front corresponding to the areas in the pupil.

BRIEF DESCRIPTION OF THE DRAWINGS

Embodiments of the invention will now be described, by way of example only, with reference to the accompanying schematic drawings in which corresponding reference symbols indicate corresponding parts, and in which.

DESCRIPTION OF PREFERRED EMBODIMENTS

According to a first embodiment of the invention the method of reducing a wave front aberration is used for alleviating effects of local lens heating within a projection system, when in use for executing a lithographic exposure process. A pattern of features of an IC layer includes a product structure 100, illustrated in FIG. 1, having dense lines and spaces 110, of critical dimension CD. The pattern 100 is embodied as a Chrome on Glass pattern, and the lines 110 and 120 are, on the mask, aligned along an x-direction of the lithographic apparatus. The product structure 100 further includes two lines 120 aligned along the x-direction as well and having a width greater than CD, and a similar non-critically sized, isolated line 130 along the y-direction.

Figure 2:
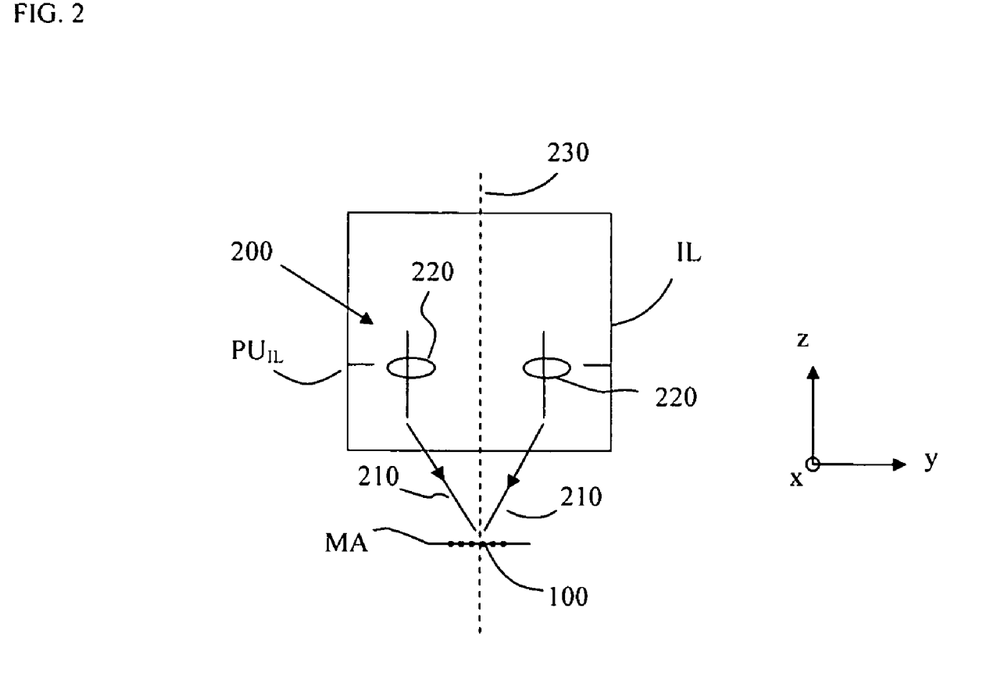
FIG. 2 depicts a dipole illumination mode for illuminating the pattern shown in FIG. 1.

As illustrated in FIG. 2, a y-dipole illumination mode 200 is used for illuminating the pattern 100 on the mask MA. Two beams of radiation 210 are emanating from two respective areas 220 disposed in a pupil $PU_{IL}$ of an illumination system IL arranged to illuminate the pattern 100. The "poles" 220 are disposed on an axis parallel to the y-direction, and at opposite positions with respect to an optical axis 230 of the illumination system.

Figure 3:
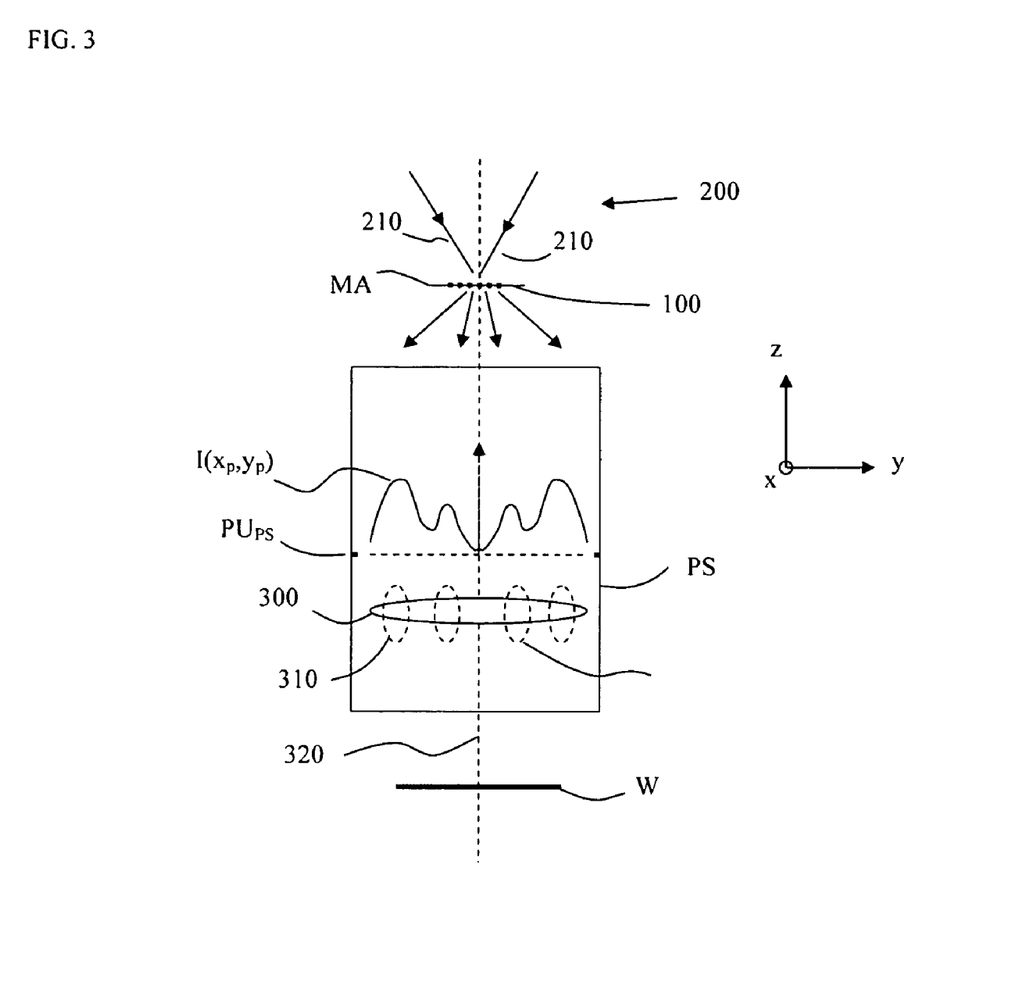
FIG. 3 illustrates a spatial intensity distribution in a pupil of the projection system and corresponding areas in a lens element subject to heating by radiation.

The beams 210 are diffracted upon traversing the mask pattern 100, and a resulting spatial distribution of radiant intensity $I(r,\theta)$ as present in a pupil $PU_{PS}$ of a projection lens PS of the apparatus is schematically depicted in FIG. 3. The coordinates r, $\theta$ are polar coordinates in a plane perpendicular to an optical axis 320 of the projection lens (parallel to the z-axis in FIG. 3), and centered with respect to the optical axis. Alternatively, the spatial distribution of the intensity I may be expressed in Cartesian pupil coordinates $x_p$, $y_p$: $I=I(x_p, y_p)$. In FIG. 3 values of the intensity I are plotted along the z-axis.

The intensity distribution I as present when an exposure of a resist layer on a substrate W is executed can be predicted using commercially available lithographic process simulation software. The present dipole illumination mode 200 in combination with diffraction of radiation at the product structure 100 generates a spatial intensity distribution $I(r,\theta)$ in the pupil of the projection lens which is shaped as a convolution of a dipole illumination pupil intensity distribution with an intensity pattern corresponding to a Fraunhofer diffraction image of the pattern 100.

Alternatively, the intensity distribution I in the projection lens pupil can be measured using a detection module and a detection method as disclosed in U.S. Pat. No. 6,710,856.

Figure 4:
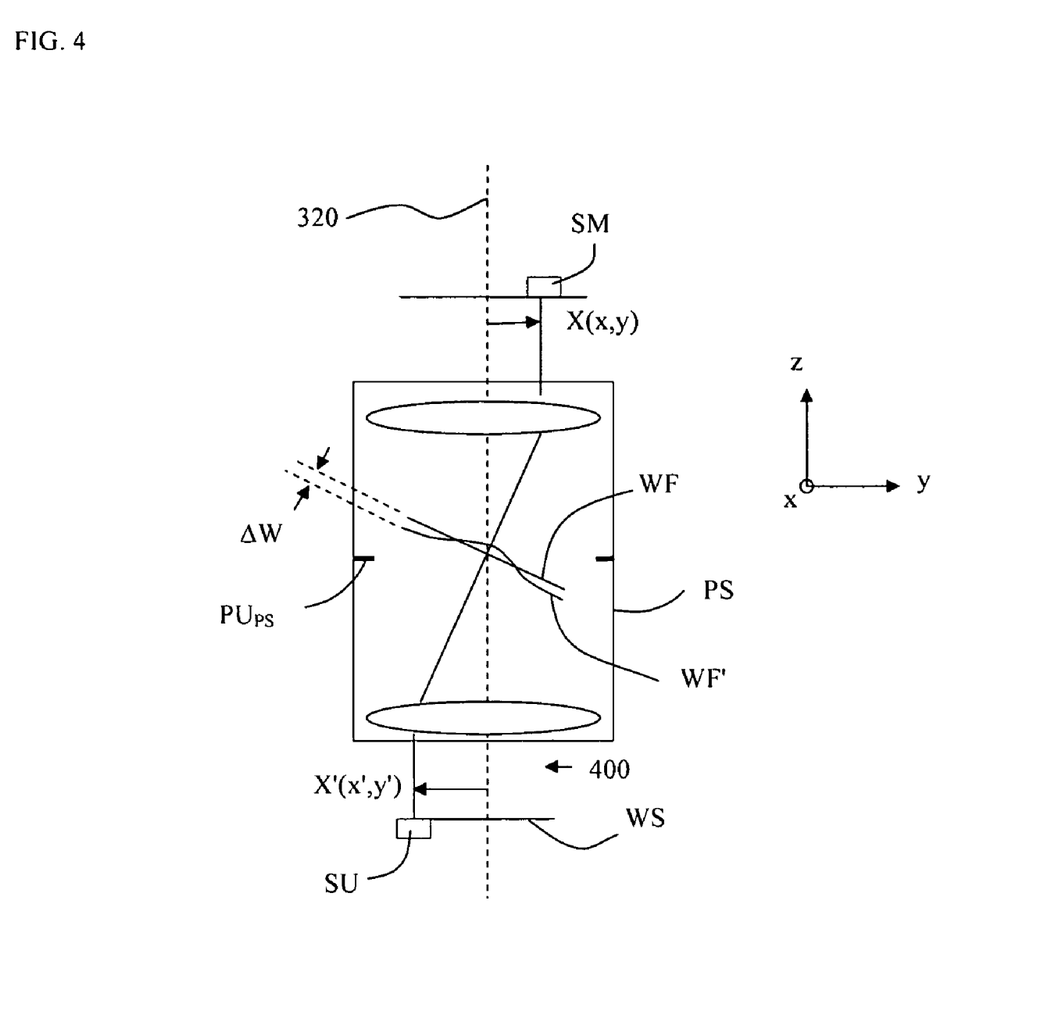
FIG. 4 depicts a source module and a sensor unit of an aberration measurement system, and a wave front aberration in the neighborhood of a projection system pupil.

For a lens element 300 disposed in the neighborhood of the projection lens pupil plane a residual absorption of projection beam radiation by the material of the lens in areas 310 causes thermal deformations of the lens element. Consequently a wave front aberration with respect to a nominal wave front may be present in the space 400 in FIG. 4, where the image formation of the mask pattern 100 is provided, and such a wave front aberration is represented by a corresponding wave front aberration $\Delta W$ of an optical wave front WF' from a nominal optical wave front WF (the latter in accordance with manufacturing specification and tolerances) in an area near the pupil $PU_{PS}$, as illustrated in FIG. 4. In the present embodiment, the wave front aberration $\Delta W$ may be due to repeated exposures of the pattern 100, and may reach a thermal steady state. The aberration can be expressed as a fraction of the wavelength of the radiation, and hence corresponds to a phase difference between the wave front WF' and the nominal wave front WF. In the pupil plane of the projection lens the phase difference $\Delta W$ is a spatially varying function of the pupil coordinates $(r,\theta)$ or, alternatively, of the pupil coordinates $(x_p, y_p)$.

It is appreciated that in the present embodiment of the invention the wave front aberration $\Delta W$ can be measured using, for example, a shearing interferometer aberration measurement system. The aberration measurement system is schematically indicated in FIG. 4 and includes a source module SM positionable in the beam path at the level of the reticle for conditioning the radiation. The source module SM is constructed and arranged to uniformly irradiate the projection lens pupil $PU_{PS}$. The radiation emanating from the source module traverses the projection system PS and is then incident on a wave front sensor unit SU at the wafer level or disposed in the wafer table of the lithographic apparatus. The sensor unit SU contains a detector, either a single detector or an array of multiple detectors, for radiation intensity measurements, whereby due to interference between sheared wave fronts a detected intensity value is related to a wave front aberration value. By performing successive intensity measurements, with a slight displacement of the source module SM with respect to the sensor unit SU, the detected radiation intensity is modulated and measurement data representative for a spatial distribution of a wave front aberration (as a function of the pupil coordinates) can be obtained. Corresponding aberration values $\Delta W(r, \theta)$ are then stored in a storage medium arranged for use with the calculation adjustments of lens elements to reduce the wave front aberration and a subsequent application of the calculated adjustments. Details of a shearing interferometer measurement system can be gleaned from United States Patent Application Publication 2002/0001088.

The wave front aberration $\Delta W(r,\theta)$ may be modeled by a sum of weighted polynomials $P_i(r,\theta)$. The contribution of each polynomial $P_i$, (with i=1, . . . , L) to the total wave front aberration is weighted by coefficients $Z_i$. The coefficients $Z_i$ are functions of the numerical aperture NA of projection lens, as well as of coordinates x', y' referring to a position X' in a field or target portion at the substrate surface, and optically conjugate to a point X with coordinates x,y at reticle level, as illustrated in FIG. 4. Thus, the wave front aberration $\Delta W(r,\theta)$ can be written as:

$$\Delta W(r, \theta) = \sum_{i=1}^{L} Z_i P_i(r, \theta). \quad (1)$$

The coefficients $Z_i$ are referred to as aberration coefficients. The polynomials $P_i$ are generally taken to be Zernike polynomials which are orthogonal over a circular area. The preselected integer L determines the number of polynomials used for the approximation, and hence its accuracy. Usually the approximation Equation (1) includes the first 37 Zernike polynomials.

The aberration coefficients $Z_i$ characterizing the projection system may depend on time t, due to for example lens heating. The value $Z_i$ (x,y,; NA; t) of a time dependent aberration coefficient may either be measured using above mentioned shearing interferometric measurement system or be estimated based on a model for predicting impact on the coefficient $Z_i$ due to absorption of radiation during exposure.

Conventionally reducing a wave front aberration $\Delta W$ includes applying one or more adjustments of optical elements of the projection system PS, such as lens elements 300 in FIG. 3 and other lens elements not shown in FIG. 3. In the present text and claims, optical elements or lens elements refer to those elements of the projection lens which in use are traversed by the radiation contributing to image formation at wafer level. Such elements may, for example be lenses, diffractive elements, liquid layers, mirrors, polarizing elements, filters or any other optical beam shaping devices. The projection lens is equipped with a limited number of lens manipulators $M_j$, with j=1 . . . J, to move one or more lenses or lens groups in one or more dimensions or, for example, to apply deformations to one or more lenses or mirrors. Lens manipulators are connected to a controller constructed and arranged to calculate and to apply manipulator settings $S_j$ as well as setting changes $\Delta S_j$, also referred to hereinafter as "adjustments". The calculating of settings $S_j$ and setting changes $\Delta S_j$ may be based on measurements of aberrations or on a feed forward prediction of required lens position and orientation adjustments based on a control-model.

A change of setting $\Delta S_j$ may be a multi dimensional change of setting involving a set $\{\Delta S_{j,k}\}$ of adjustments, with k=1, 2, . . . K, in accordance with K degrees of freedom of adjustment numbered "j". The adjustments may include, for example, position adjustments such as displacements along an optical axis 320 in FIGS. 3 and 4, or displacements along the x and y axes, or a combination of such displacements. In addition or alternatively, adjustments may include rotational movements of lens elements in one or more degrees of rotational freedom. Other types of adjustments may be arranged to change physical properties of projection system optical elements which affect the phase of a wave front traversing the element.

The actual, in-situ wave front aberration of a projection system depends on the values of the settings $S_j$. Assuming for simplicity that the value of nominal settings $S_j$ is zero, a change of aberration coefficient $\Delta Z_i$ due to a change of manipulator settings can in first approximation be written as $$\Delta Z_i = \sum_{j,k} C_{a;i,j,k} \Delta S_{j,k}, \quad (2)$$

where the coefficients $C_{a;i,j,k}$ are sensitivity coefficients expressing a sensitivity of an aberration to an adjustment $\Delta S_{j,k}$:

$$C_{a;i,j,k} = \frac{\partial \Delta Z_i}{\partial \Delta S_{j,k}}. \quad (3)$$

It is appreciated that the sensitivity coefficients $C_{a;i,j,k}$ can be obtained from aberration measurements and a fitting of a model in accordance with Equation (1) to measured aberration changes after applying a known set of adjustments. Further details of such a procedure for obtaining sensitivity coefficients can be gleaned from United States Patent Application Publication US 2003/0071986.

Figure 5:
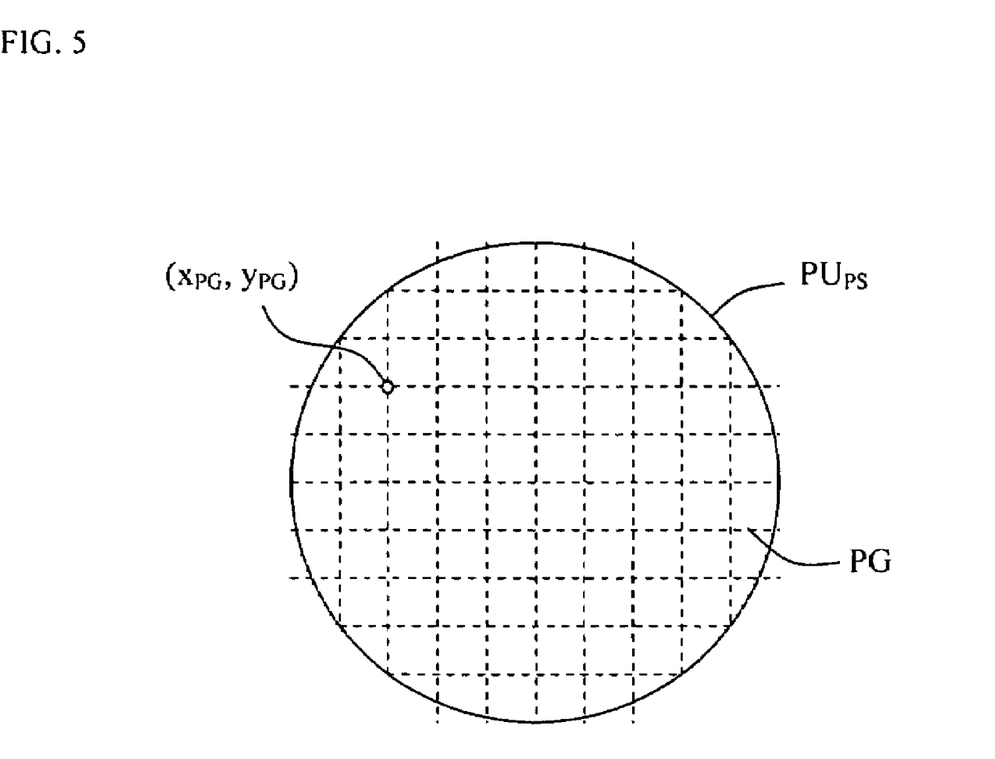
FIG. 5 depicts a conventional grid of points in the projection lens pupil where wave front aberrations are minimized.

A conventional method of reducing the wave front aberration $\Delta W$ involves minimizing a root mean square (RMS) value of the aberration $\Delta W$ at points $x_{PG}$, $y_{PG}$ of a notional grid PG covering the whole clear aperture of the projection system pupil $PU_{PS}$, and related to a preselected set of object points (at mask level) on a notional grid FG (not shown in the Figures) covering the illuminated field at mask level. FIG. 5 schematically indicates a lay-out of the grid PG covering the clear aperture of the projection system pupil $PU_{PS}$. The corresponding RMS value of the aberration $\Delta W$ is indicated as RMS($\Delta W$, PG, FG).

The dependency of the wave front aberration on the adjustments is obtained by substituting $Z_i - \Delta Z_i$ for $Z_i$ in Equation (1):

$$\Delta W(r, \theta) = \sum_{i=1}^{L} (Z_i - \Delta Z_i) P_i(r, \theta), \quad (4)$$

and substituting Equation (2) for $\Delta Z_i$. Then, a least square fit is applied using measured (or otherwise obtained) wave front aberration data (such as for example values of Zernike aberration coefficients) to solve for the required values of adjustments $\Delta S_{j,k}$ which minimize RMS($\Delta W$, PG, FG).

Figure 6:
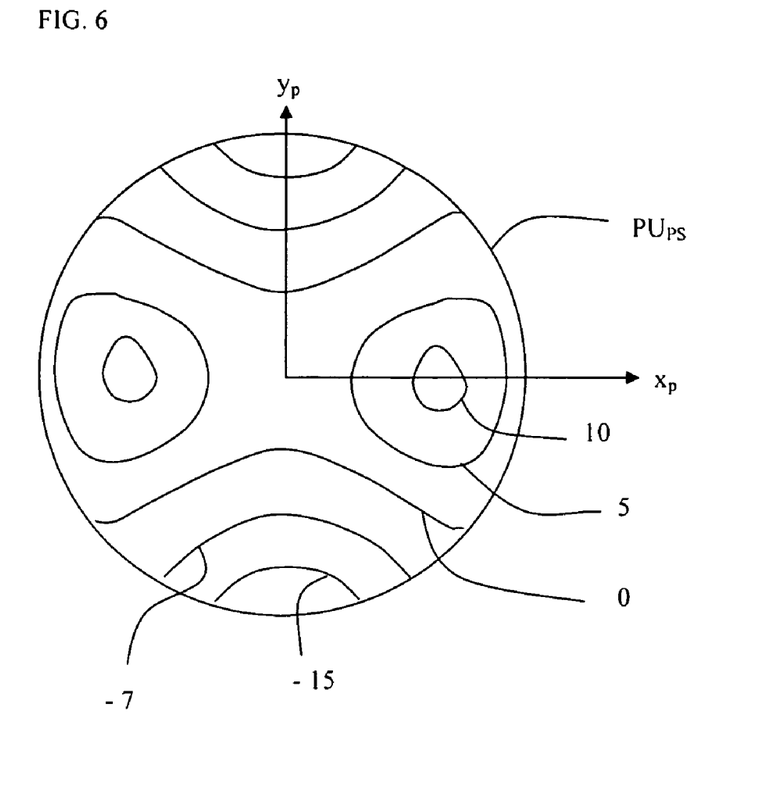
FIG. 6 depicts contour lines of residual wave front aberration in nm, near the pupil of the projection system, and a corresponding grey tone image, typical for a result of a conventional aberration reduction method.

FIG. 6 illustrates the result of such a conventional wave front aberration reduction for the present embodiment wherein the pattern 100 is imaged using the dipole illumination mode 200. Contour lines of equal aberration, expressed in nm, are depicted and a corresponding grey tone image is shown as well. Due to the use of the dipole illumination mode 200, lens heating occurs in similar dipolar areas of projection lens elements such as lens elements 300 disposed near the pupil $PU_{PS}$. A resulting wave front aberration can only partially be compensated using the limited number of available lens manipulators. A residual, saddle shaped wave front aberration distribution remains present, in spite of optimally chosen lens manipulator settings. As shown in FIG. 6, along the y-axis in the projection lens pupil $PU_{PS}$, the residual wave front aberration has a positive peak value at the center ($y_p$=0) and decreases to a negative phase error value (obtained by normalizing the contour line value by the wavelength of the radiation) at the edges of the pupil, whereas along the x-axis the value of the wave front aberration has a minimum value at the center ($x_p=0$) and increases towards the edge of the pupil. The remaining saddle shaped wave front error is to be further reduced.

According to an embodiment of the present invention data representing the spatial intensity distribution $I(x_{PG}, y_{PG})$ on the grid PG are stored and local intensities are compared to a preselected threshold intensity for each grid point $x_{PG}, y_{PG}$. From the intensity data a maximum intensity $I_{max}$ is identified, and a threshold intensity $I_T$ is selected from a range defined by, for example, the half maximum intensity $0.5\,I_{max}$ and an intensity equal to one tenth of the maximum intensity, $0.1\,I_{max}$, which is a suitable range for use with the present method. Subsequently, only those grid points where the intensity $I>I_T$ are retained for use with a least square fit minimization of the RMS value of the wave front aberration $\Delta W$.

Figure 7:
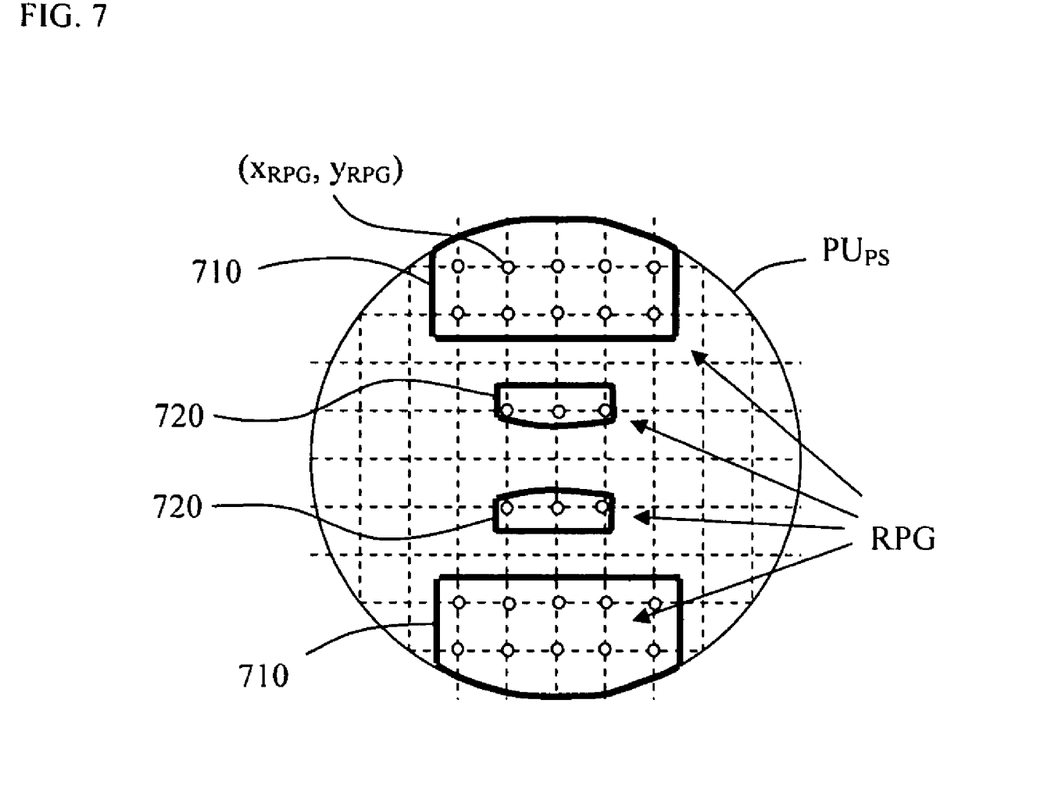
FIG. 7 depicts areas and a grid of points in the projection lens pupil where wave front aberrations are minimized according to an embodiment of the present invention.

The grid consisting of the reduced set of grid points whereby $I>I_T$ is denoted by RPG, and is schematically indicated by points $(x_{RPG}, y_{RPG})$ in FIG. 7. The areas 710 and 720 are the areas in the projection lens pupil $PU_{PS}$ where the intensity relation $I>I_T$ is satisfied. The effect on the shape of the intensity distribution $I(x_p, y_p)$ of off-axis dipole illumination 200 of the pattern 100 is visible through the presence of the dipole-like areas 710 disposed at the edge of the pupil clear aperture, whereas the areas 720 are typical for the effect of the presence of semi dense and isolated structures such as the lines 120 and 130 of the pattern 100.

In the present embodiment of the invention the reducing of the wave front aberration $\Delta W$ involves minimizing the RMS value of the wave front aberration $\Delta W(r,\theta)$ as present at just the limited set of grid points $(x_{RPG}, y_{RPG})$ of the grid RPG. This limited set covers only the areas 710 and 720 in FIG. 7 of the projection system pupil $PU_{PS}$. Further, the RMS value includes these wave front aberrations for a preselected set of object points (at mask level) on a notional grid FG covering the illuminated field at mask level. The corresponding RMS value is denoted hereinafter by $RMS(\Delta W, RPG, FG)$.

Figure 8:
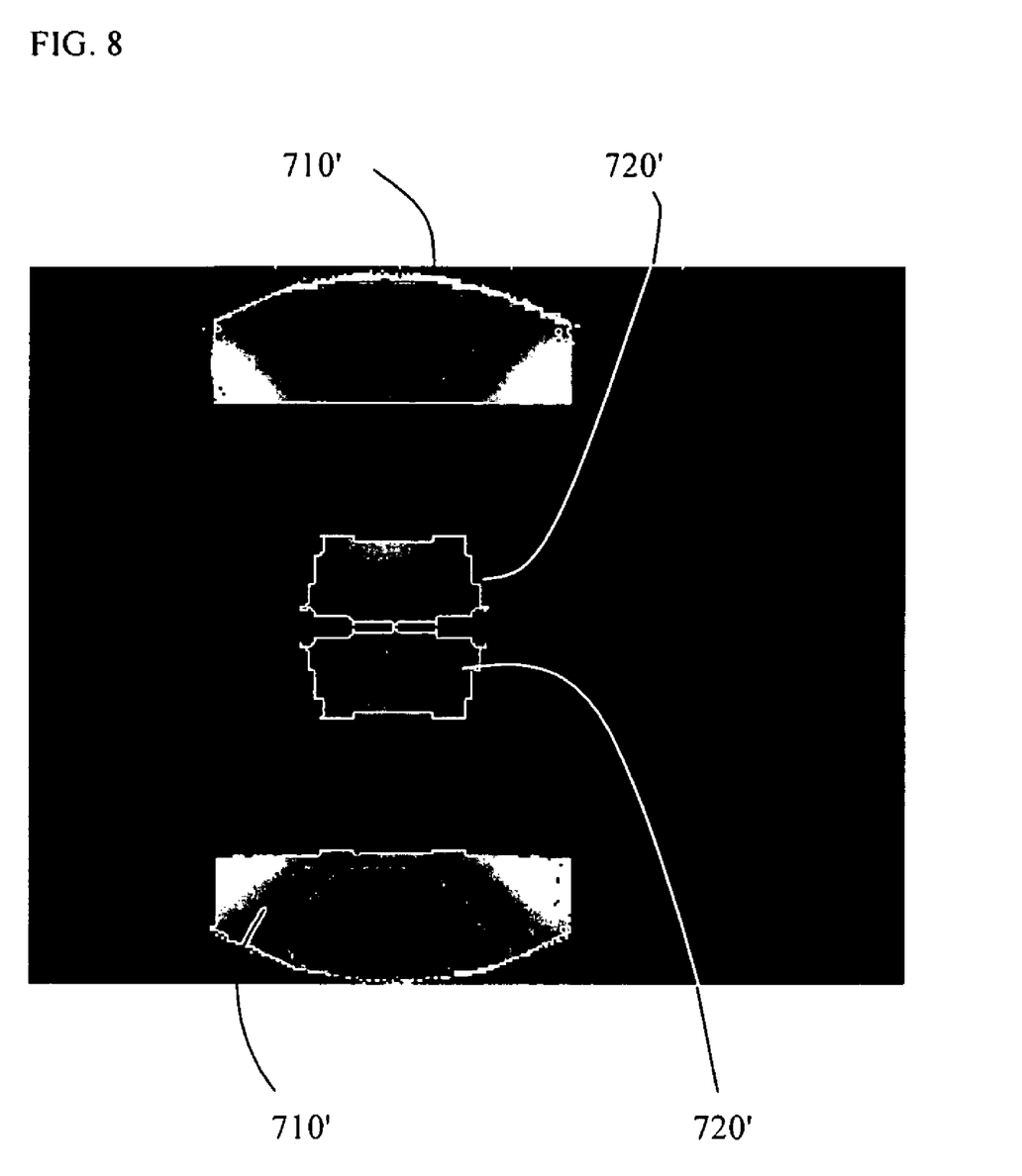
FIG. 8 depicts a grey tone image corresponding to the contour lines of FIG. 6 and the areas of FIG. 7.

FIG. 8 schematically indicates, through a variation of greytone, the presence of a spatially varying wave front aberration $\Delta W$ in areas 710' and 720' of the wave front corresponding to the respective areas 710 and 720 in the pupil, before applying the method of reducing the aberration according to an embodiment of the present invention. The wave front aberration corresponds to the aberration depicted in FIG. 6, and can be obtained by an aberration measurement as described above. It is appreciated that a shearing interferometric measurement of wave front aberration is based on capturing a pattern of interference fringes in an image of the projection lens pupil $PU_{PS}$ using a pixelated image detector (such as for example a rectangular array of CCD detectors). Each pixel of the detector is associated with a corresponding position in the pupil $PU_{PS}$ so that areas 710' and 720' of the wave front corresponding to the respective areas 710 and 720 in the pupil can readily be identified.

Figure 9:
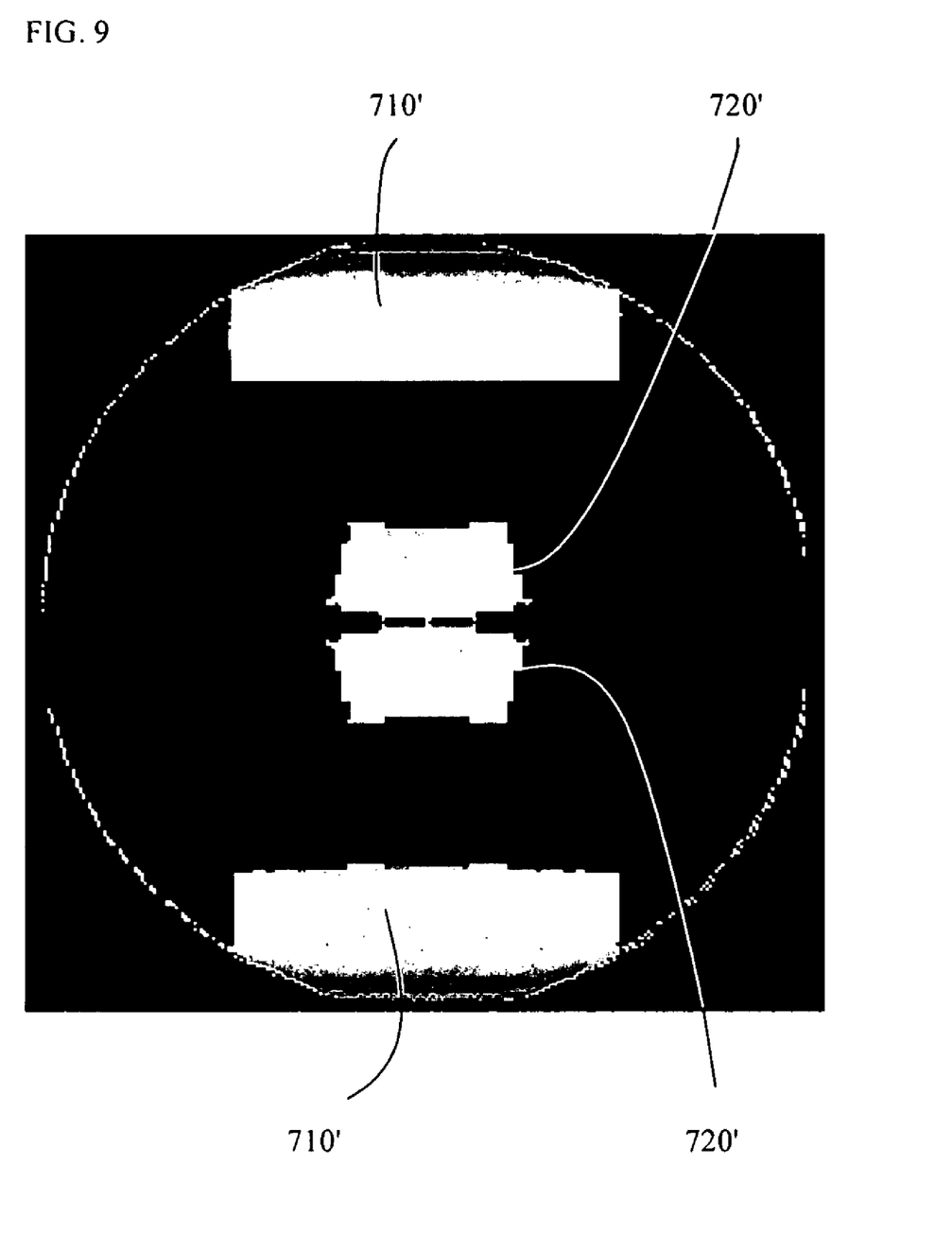
FIG. 9 depicts a grey tone image representing residual aberration as a result of an aberration reduction in accordance with an embodiment of the present invention, for the pupil areas of FIG. 7.

Next the RMS value $RMS(\Delta W, RPG, FG)$ is minimized by applying a conventional least square fit algorithm using exclusively the measured (or otherwise obtained) wave front aberration data in relation to the reduced set of grid points $(x_{RPG}, y_{RPG})$ of the grid RPG. The measured or otherwise obtained wave front aberration data may be provided in the form of values of Zernike aberration coefficients, values of coeffficients weighting orthogonal polynoials other than Zernike polynomials, and "direct" values of $\Delta W$ at points $x_{RPG}, y_{RPG}$, i.e., values obtained without using a model based on an expansion in polynomials. The least square fit algorithm provides a number of equations which can be solved for the required values of adjustments $\Delta S_{j,k}$ which minimize $RMS(\Delta W, RPG, FG)$. FIG. 9 illustrates the result of such a wave front aberration reduction for the present embodiment. The variation of grey-tone in the selected pupil areas is substantially absent. Hence, the contribution of the saddle shaped aberration distribution is reduced in the areas 710' and 720' of the wave front which substantially contribute to local image formation at wafer level. To obtain the present result only further changes of the Zernike aberration coefficients $Z_4$, $Z_9$, and $Z_{16}$ over their values required for obtaining optimal aberration correction of the whole clear aperture of the pupil $PU_{PS}$ (see FIG. 6) we needed. The higher order aberrations associated with $Z_9$ and $Z_{16}$ (spherical aberration) can readily be provided by using available lens manipulator degrees of freedom for lens element adjustments.

An advantage of the present embodiment is that the limitation to grid point of the grid RPG of the least square fitting substantially reduces the size of matrices occurring in the least square fitting algorithms and the amount of calculations and computing time needed for the least square fitting. Such a substantial reduction enables a relatively fast, in situ optimization of the lens element settings in a production environment. Another advantage of the limitation of the wave aberration reduction to the selected areas is that higher order aberrations which over the whole pupil remain uncorrectable (see FIG. 6) can now over the limited pupil be corrected and reduced down to a substantially better (lower) level of magnitude. A reduction of thermally induced residual RMS wave front error by a factor two is obtainable for lithographic processes whereby a dipole illumination mode is used.

It is appreciated that an embodiment of the invention in particular addresses a problem associated with conventional resolution enhancement techniques in conjunction with the demand for increased throughput (and hence, higher power of the radiation used for exposure). Conventional resolution enhancement techniques used for imaging and printing patterns including CD sized dense features generally include using an off-axis multi-pole illumination mode for illuminating the reticle pattern. Such an illumination mode is characterized by a plurality of separate, off-axis bright areas in a pupil of the illumination system. Multi-pole off-axis illumination in combination with diffraction of radiation at the mask pattern typically generates a spatial intensity distribution in a pupil of the projection lens which is spatially modulated, wherein a plurality of separate areas of relative high radiation intensity are present. Resolution enhancement techniques not only concern the imaging of COG patterns, but also concern the use of patterned phase shifting masks in combination with either on axis illumination or multi-pole off-axis illumination. In either case a strongly modulated intensity profile in the projection lens pupil is present, causing similar patially modulated lens temperature distributions in projection lens elements traversed by the imaging radiation, and induced during one or more exposures. As explained n detail above, such a modulated temperature distribution causes optical wave aberration errors beyond tolerance. Consequently, also printed pattern errors may be beyond tolerance in a situation wherein a lens pupil intensity distribution is characterized by a non uniform intensity distribution including off-axis bright "poles" of radiation flux. Therefore, the method of the present embodiment of the invention provides an improved control over printed pattern errors as occurring with conventional high throughput, enhanced resolution lithographic processes.

Figure 10:
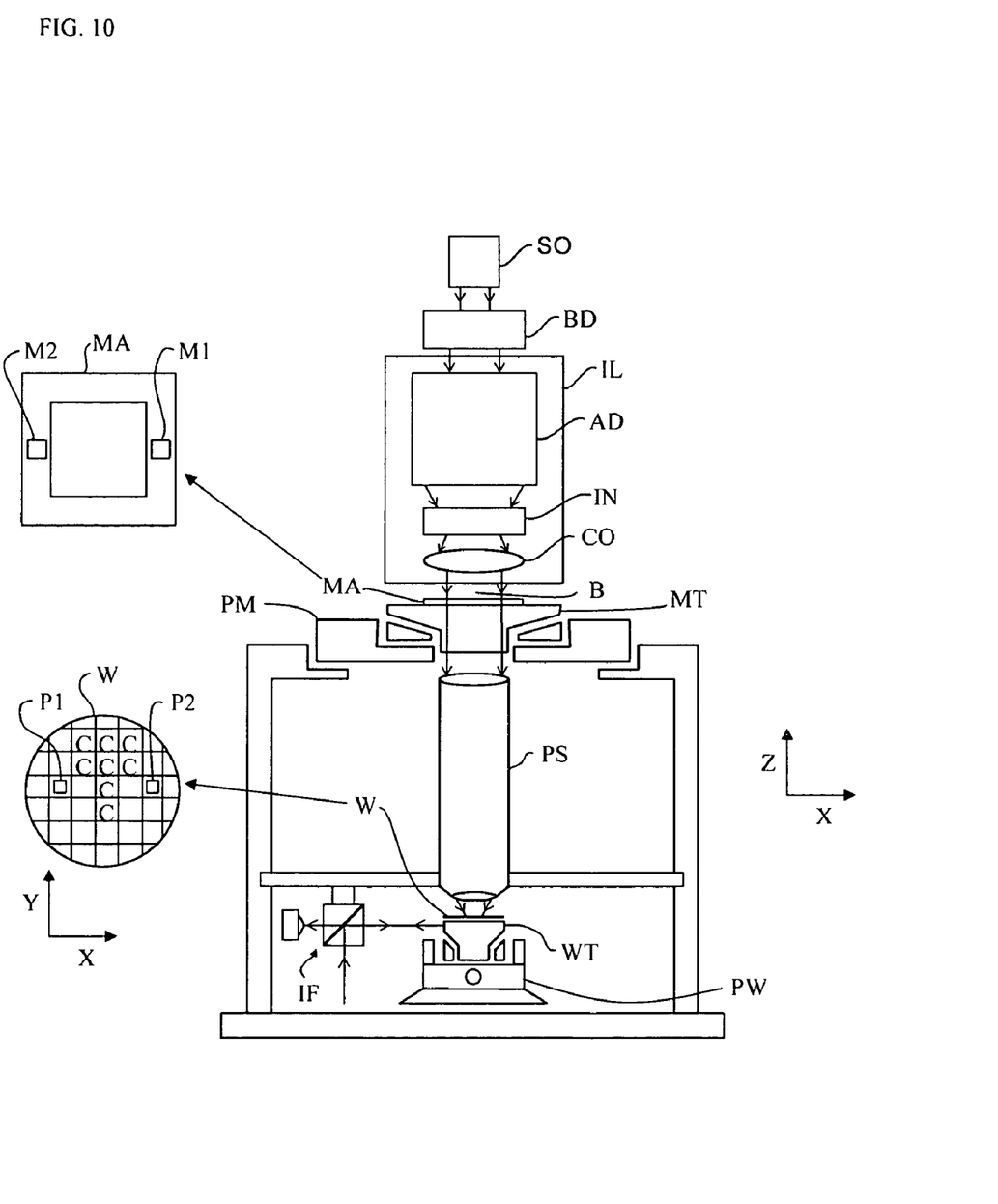
FIG. 10 depicts a flow diagram illustrating a method of manufacturing a device according to an embodiment of the present invention.

A lithographic apparatus according to the embodiment of the present invention is schematically depicted in FIG. 10. The apparatus comprises:

an illumination system (illuminator) IL configured to condition a radiation beam B (e.g. of UV radiation, or DUV radiation such as for example generated by an excimer laser operating at a wavelength of 248 or 193 nm, or of EUV radiation provided by a laser-fired plasma source operating at 13,6 nm).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 10, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 10) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus, according to an embodiment of the present invention, includes a source module SM and a sensor unit SU as illustrated in FIG. 4, constructed and arranged to execute an interferometric wave front aberration measurement. The source module SM may be part of the support structure to support the pattern. Alternatively, a mask may be provided with a source module SM. A fiducial of the substrate table WT may be embodied as part of the sensor unit SU or may include a sensor unit SU. It is appreciated that the method of an embodiment of the present invention is not limited to embodiments wherein the lithographic apparatus includes an aberration measurement system or an interferometric aberration measurement system. The information on the wave front aberration may alternatively be obtained by means of other known spatially resolving aberration measurement systems, such as systems based on a Hartman test, or on image analysis of dedicated test structures included in a mask pattern. Alternative systems need not necessarily be based on interferometric measurement of wave front aberrations, neither need they be part of the lithographic apparatus. Aberration data may be measured or predicted (using conventional simulation programs) separate from running the process, and be stored in a storage medium for use with the present method.

According to a second embodiment of the invention there is provided a computer program product comprising program code to control the lithographic apparatus to perform a device manufacturing method comprising obtaining information on the wave front aberration $\Delta W$, calculating at least one adjustment $\Delta S_{j,k}$ of at least one optical element of the projection system PS for reducing the wave front aberration $\Delta W$, applying the calculated at least one adjustment to the projection system, whereby the calculating includes obtaining information on a spatial distribution $I(x_p, y_p)$ of radiant intensity in a pupil $PU_{PS}$ of the projection lens PS as present during exposing a radiation sensitive layer on top of a substrate W, selecting a threshold intensity $I_T$ in a range between a maximum intensity $I_{max}$ of the distribution of intensity $I(x_p, y_p)$ and zero, defining areas in the pupil within which a local intensity is higher than the threshold intensity $I_T$, and limiting the reducing to areas of the wave front corresponding to the areas in the pupil.

The control of the lithographic apparatus is used to reducing the wave front aberration $\Delta W$ of an optical wave traversing a projection system of the lithographic apparatus.

Figure 11:
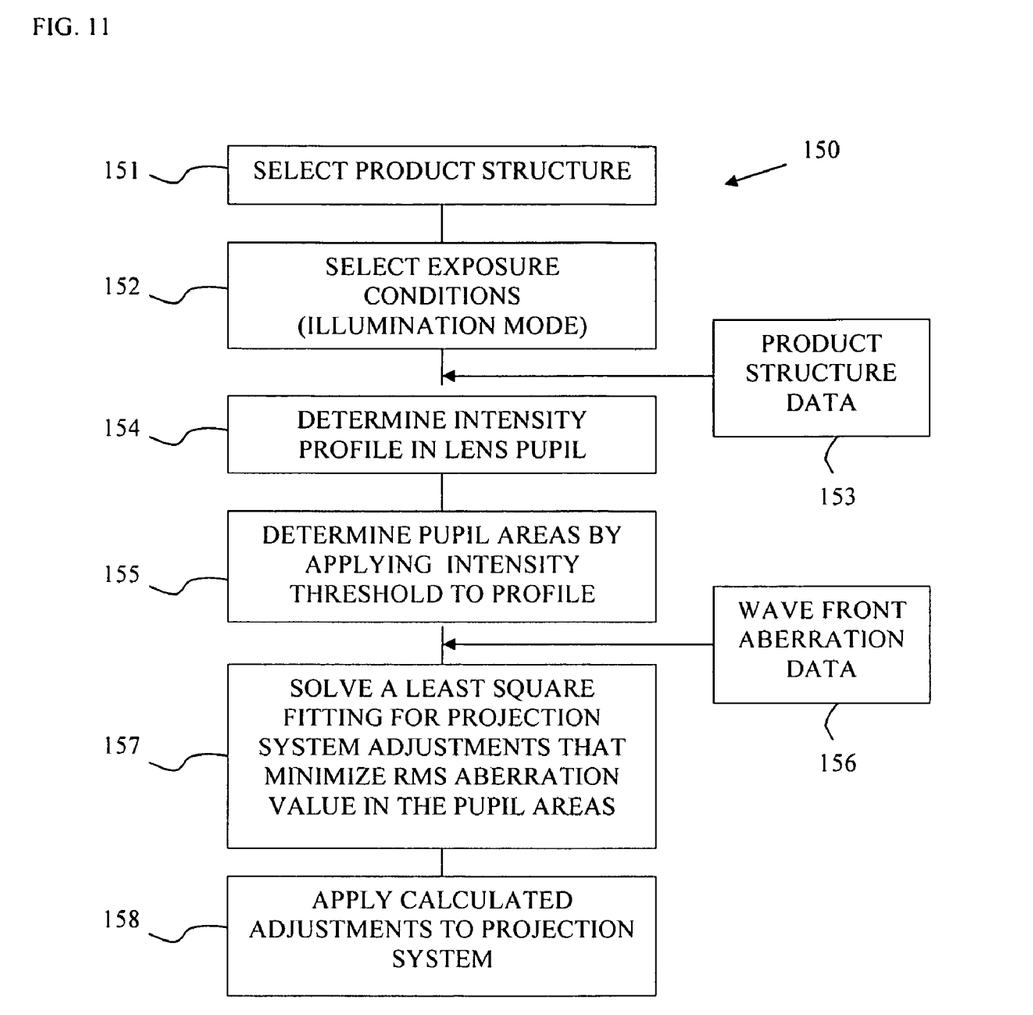
FIG. 11 depicts a lithographic apparatus according to an embodiment of the invention.

FIG. 11 depicts the steps executed under control of the computer program product are shown in more detail in a flow diagram 150.

Figure 1:
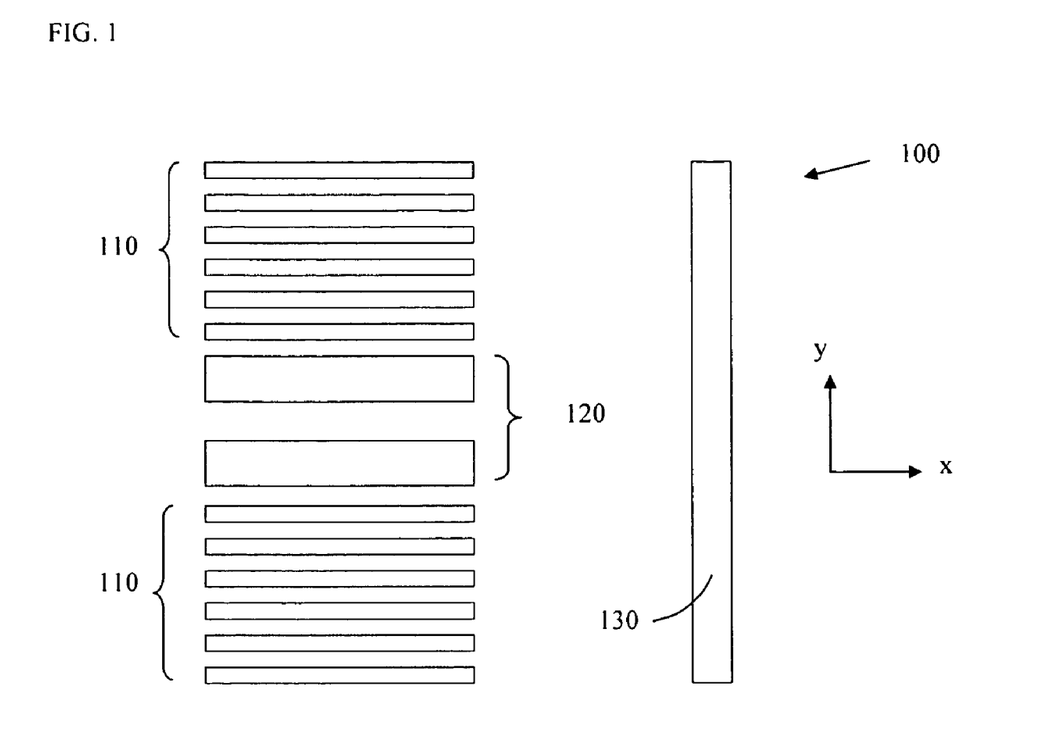
FIG. 1 depicts a portion of a device pattern.

A product structure 100 is selected (step 151). The selected product structure may be a portion of an IC layer pattern, such as depicted in FIG. 1. However, it is appreciated that the product structure may also be a complete pattern at full die size, or a portion of such a pattern which is illuminated during scanning of the mask pattern in a step-and scan apparatus. Alternatively, the selected product structure may also be a constituent part of an IC layer pattern where a double patterning lithographic process is executed, and where the present method is applied to one or both imaging steps in such a process.

Next, the exposure conditions shall be identified and selected (step 152). The exposure conditions for the actual lithographic exposure and printing of the actual layer pattern, as embodied in a die, include the preferred illumination mode. The illumination mode to be used may, depending on the details of the mask pattern, for example be a multi-pole illumination mode (such as dipole and quadrupole modes), a soft multi-pole mode, or a combination of an on axis conventional illumination mode with either off-axis multi-pole illumination or annular illumination.

In step 154, the intensity distribution $I(x_p, y_p)$ is calculated using conventional methods, based on the illumination mode characteristics and the mask pattern data (including data 153 concerning the product structure) describing geometry characteristics and physical characteristics of pattern features. Alternatively, a lens pupil measurement system can be used to obtain data representing the intensity profile $I(x_p, y_p)$.

As described in the first embodiment, the next step 155 is the thresholding of the intensity profile to identify and select the areas in the pupil where the flux of radiation traversing the pupil is highest. Aberration correction in these areas is most effective for alleviating the effect of absorption of radiation causing local thermal deformations of projection system optical elements.

Wave front aberration data 156, that were obtained through aberration measurement or through simulation using a conventional optical wave propagation analysis program, are retrieved from a storage medium and the wave front aberration data pertaining to the areas in the pupil defined in step 155 are maintained for a following calculation of required projection-system optical-element adjustments.

The calculated adjustments are found (step 157) as the solution of a least square fitting which minimizes a root mean square value of the wave front aberration in the pupil areas determined in step 155.

Finally, the adjustments are applied to the respective optical elements of the projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCD's), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A method of reducing a wave front aberration of an optical wave traversing a projection system of a lithographic apparatus constructed and arranged to expose a radiation sensitive layer on a substrate to an image of a pattern, the method comprising:

obtaining information on the wave front aberration;

calculating an adjustment of an optical element of the projection system for reducing the wave front aberration; and applying the calculated adjustment to the projection system, wherein the calculating includes:

obtaining information on a spatial distribution of radiant intensity in a pupil of the projection system as present during the exposure of the radiation sensitive layer, selecting a threshold intensity in a range between maximum intensity of the distribution of intensity and zero, defining areas in the pupil within which a local intensity is higher than the threshold intensity, and limiting the reducing to areas of the wave front corresponding to the areas in the pupil.

2. A method according to claim 1 wherein the exposure of the radiation sensitive layer includes illuminating the pattern with a multi-pole illumination mode.

3. A method according to claim 2 wherein the multi-pole illumination mode is a dipole illumination mode or a quadrupole illumination mode.

4. A method according to claim 1 wherein the pattern is a chrome on glass mask pattern or a phase shifting mask pattern.

5. A method according to claim 1 wherein the obtaining information on the wave front aberration includes measuring wave front aberration.

6. A method according to claim 1 wherein obtaining information on the wave front aberration includes predicting wave front aberration changes based on a model for predicting impact on wave front aberration of temperature changes of an optical element of the projection system.

7. A method according to claim 1 wherein the adjustment includes (i) a position adjustment in a plane perpendicular to an optical axis of the projection system, or (ii) a position adjustment along the optical axis, or (iii) a rotational position adjustment in a rotational degree of freedom, or (iv) a change of a shape of an optical element surface, or (v) any combination of (i)-(iv).

8. A method according to claim 1 wherein the obtaining information on a spatial distribution of radiant intensity in a pupil includes measuring the spatial distribution of radiant intensity.

9. A method according to claim 1 wherein the obtaining information on a spatial distribution of radiant intensity in a pupil includes predicting the spatial intensity distribution based on data including data representing a selected illumination mode and data representing the pattern.

10. A method according to claim 1 wherein the threshold intensity is selected in a range between half of the maximum intensity and one tenth of the maximum intensity.

11. A method according to claim 1 wherein the defining areas in the pupil includes comparing local intensity values at grid points of a notional grid extending over the pupil to the threshold intensity value, and retaining grid points where the local intensity value is higher than the threshold intensity value for a subsequent calculation of the adjustment.

12. A method according to claim 1 wherein the reducing includes applying a least square fit algorithm to minimize a root mean square value of a plurality of wave front aberration values, and fitting the adjustment.

13. A method according to claim 12 wherein the plurality of wave front aberration values include aberration values for a plurality of points in the areas in the pupil within which a local intensity is higher than the threshold intensity.

14. A method according to claim 13 wherein the plurality of wave front aberration values include aberration values for a plurality of field points in the image.

15. A computer readable storage medium comprising program code to control a lithographic apparatus to perform a device manufacturing method comprising:

obtaining information on a wave front aberration of an optical wave traversing a projection system of the lithographic apparatus; and calculating an adjustment of an optical element of the projection system for reducing the wave front aberration, wherein the calculating includes:

obtaining information on a spatial distribution of radiant intensity in a pupil of the projection system as present during exposing a radiation sensitive layer provided on a substrate, selecting a threshold intensity in a range between maximum intensity of the distribution of intensity and zero, defining areas in the pupil within which a local intensity is higher than the threshold intensity, and limiting the reducing to areas of the wave front corresponding to the areas in the pupil.

16. A computer readable storage medium according to claim 15 wherein the threshold intensity is selected in a range between half of the maximum intensity and one tenth of the maximum intensity.

17. A computer readable storage medium according to claim 15 wherein the defining areas in the pupil includes comparing local intensity values at grid points of a notional grid extending over the pupil to the threshold intensity value, and retaining grid points where the local intensity value is higher than the threshold intensity value for a subsequent calculation of the adjustment.

18. A computer readable storage medium according to claim 15 wherein the reducing includes applying a least square fit algorithm to minimize a root mean square value of a plurality of wave front aberration values, and fitting the adjustment.

19. A computer readable storage medium according to claim 18 wherein the plurality of wave front aberration values include aberration values for a plurality of points in the areas in the pupil within which a local intensity is higher than the threshold intensity.

20. A computer readable storage medium according to claim 19 wherein the plurality of wave front aberration values include aberration values for a plurality of field points in the image.

21. A computer readable storage medium according to claim 15 wherein the obtaining information on a spatial distribution of radiant intensity in a pupil includes predicting the spatial intensity distribution based on data including data representing a selected illumination mode and data representing the pattern.

\* \* \* \* \*